US008384063B2

(12) United States Patent
Kondo et al.

(10) Patent No.: US 8,384,063 B2

(45) Date of Patent: Feb. 26, 2013

(54) LIGHT EMITTING DEVICE

(75) Inventors: Katsufumi Kondo, Tokyo (JP); Ryo Saeki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/345,801

(22) Filed: Jan. 9, 2012

(65) Prior Publication Data

US 2012/0104357 A1 May 3, 2012

Related U.S. Application Data

(62) Division of application No. 12/434,056, filed on May 1, 2009, now Pat. No. 8,115,192.

(30) Foreign Application Priority Data

Sep. 12, 2008 (JP) ................................ 2008-234875

(51) Int. Cl.

*H01L 29/06* (2006.01)
*H01L 31/072* (2006.01)
*H01L 31/109* (2006.01)
*H01L 31/0328* (2006.01)
*H01L 31/0336* (2006.01)

(52) U.S. Cl. .............................. 257/13; 257/88; 372/64

(58) Field of Classification Search .................... 257/13, 257/14, 88; 372/64

See application file for complete search history.

(56) References Cited

U.S. PATENT DOCUMENTS 6,121,635 A 9/2000 Watanabe et al.
6,384,430 B1 * 5/2002 Nakatsu et al. ............... 257/103
6,586,773 B2 7/2003 Saeki et al.
6,631,150 B1 10/2003 Najda
6,649,942 B2 11/2003 Hata et al.
6,846,686 B2 1/2005 Saeki et al.
6,936,864 B2 8/2005 Kondo
2003/0043875 A1 * 3/2003 Gen-Ei et al. ................... 372/46
2004/0079967 A1 4/2004 Shakuda et al.
2006/0220031 A1 * 10/2006 Krames et al. .................. 257/79
2008/0083919 A1 * 4/2008 Takahashi et al. ............. 257/13
2008/0164457 A1 7/2008 Furukawa et al.
2009/0052489 A1 2/2009 Nomura
2009/0224269 A1 9/2009 Saeki et al.
2010/0207096 A1 8/2010 Tang et al.

FOREIGN PATENT DOCUMENTS

JP 01-204489 8/1989
JP 08-306956 11/1996
JP 2001-144322 5/2001
JP 2001-339100 12/2001
JP 2004-221356 8/2004

(Continued)

OTHER PUBLICATIONS

U.S. Office Action mailed May 4, 2011 corresponding to U.S. Appl. No. 12/434,056, filed May 1, 2009.

(Continued)

*Primary Examiner* — Phuc Dang

(74) *Attorney, Agent, or Firm* — Turocy & Watson, LLP

(57) ABSTRACT

A light emitting device includes a stacked body including at least a light emitting layer made of $In_x(Al_yGa_{1-y})_{1-x}P$ ($0 \leqq x \leqq 1$, $0 \leqq y \leqq 1$), a p-type cladding layer made of $In_x(Al_yGa_{1-y})_{1-x}P$ ($0 \leqq x \leqq 1$, $0 \leqq y \leqq 1$), and a bonding layer made of a semiconductor; and a substrate in which deviation in a lattice constant at a bonding interface with the bonding layer is larger than deviation in lattice constants between the light emitting layer and the bonding layer. The p-type cladding layer is located more distant from the bonding interface than the light emitting layer, and the p-type cladding layer has a carrier concentration of $0.5\times10^{17}$ $cm^{-3}$ or more and $3\times10^{17}$ $cm^{-3}$ or less.

8 Claims, 6 Drawing Sheets

FOREIGN PATENT DOCUMENTS

| | | |
|---|---|---|
| JP | 2004-260109 | 9/2004 |
| JP | 2004-296707 | 10/2004 |
| JP | 2007-059873 | 3/2007 |
| JP | 2007-123435 | 5/2007 |
| JP | 2007-258320 | 10/2007 |

OTHER PUBLICATIONS

Japanese Office Action for Japanese Application No. 2008-234875 mailed on Jul. 30, 2012.

Japanese Office Action for Japanese Application No. 2008-234875 mailed on Dec. 7, 2012.

* cited by examiner

LIGHT EMITTING DEVICE

CROSS-REFERENCE TO RELATED APPLICATIONS

This application is a Division of application Ser. No. 5 12/434,056 filed May 1, 2009, U.S. Pat. No. 8,115,192; the entire contents of which are incorporated herein by reference.

This application is based upon and claims the benefits of priority from the prior Japanese Patent Application No. 2008-234875, filed on Sep. 12, 2008; the entire contents of which are incorporated herein by reference.

BACKGROUND OF THE INVENTION

1. Field of the Invention

This invention relates to a light emitting device.

2. Background Art

A light emitting device for automobile use is used under strict conditions, and the required level of reliability has been increasingly demanding. In the case where a stoplight or taillight based on light with a wavelength near 615 nm is used in two states such as high and low brightness, the brightness degradation rate for long-term operation is required to be comparably low for both states.

If the light emitting device is formed on a translucent substrate such as GaP, optical absorption in the substrate can be reduced. Furthermore, a structure including a metal reflecting film below the light emitting layer allows emission light to be efficiently emitted outside the device. These facilitate increasing the brightness.

Furthermore, reducing crystal defects in the light emitting layer or preventing acceptors such as Zn from diffusing into the light emitting layer facilitates reducing variation in the brightness degradation rate.

JP-A-2007-123435 (Kokai) discloses a technique related to a light emitting device with small chip size and sufficient reliability. In this technique, a light emitting layer formed on a GaAs substrate is bonded to a GaP substrate, and then the GaAs substrate is removed to achieve high brightness.

However, even this technique is not sufficient to reduce degradation in a wide brightness range from low to high brightness.

SUMMARY OF THE INVENTION

According to an aspect of the invention, there is provided a light emitting device including: a stacked body including at least a light emitting layer made of Inx(AlyGa1-y)1-xP (0≦x≦1, 0≦y≦1), a p-type cladding layer made of Inx (AlyGa1-y)1-xP (0≦x≦1, 0≦y≦1), and a bonding layer made of a semiconductor; and a substrate in which deviation in a lattice constant at a bonding interface with the bonding layer is larger than deviation in lattice constants between the light emitting layer and the bonding layer, the p-type cladding layer being located more distant from the bonding interface than the light emitting layer, and the p-type cladding layer having a carrier concentration of $0.5\times10^{17}$ $cm^{-3}$ or more and $3\times10^{17}$ $cm^{-3}$ or less.

According to another aspect of the invention, there is provided a light emitting device including: a stacked body including at least a light emitting layer made of Inx(AlyGa1-y)1-xP (0≦x≦1, 0≦y≦1), a p-type cladding layer made of Inx(AlyGa1≦y)1-xP (0≦x≦1, 0≦y≦1), and a bonding layer made of a semiconductor; and a substrate in which deviation in a lattice constant at a bonding interface with the bonding layer is larger than deviation in lattice constants between the light emitting layer and the bonding layer, the substrate being conductive and transparent to emission light from the light emitting layer, the p-type cladding layer being located more distant from the bonding interface than the light emitting layer, the p-type cladding layer having a carrier concentration of $0.5\times10^{17}$ $cm^{-3}$ or more and $3\times10^{17}$ $cm^{-3}$ or less, and the light emitting layer and the p-type cladding layer being sequentially crystal grown on a surface of the bonding layer on the opposite side of the bonding interface.

According to another aspect of the invention, there is provided a light emitting device including: a substrate; a stacked body including at least a light emitting layer made of Inx (AlyGa1-y)1-xP (0≦x≦1, 0≦y≦1), a p-type cladding layer made of Inx(AlyGa1-y)1-xP (0≦x≦1, 0≦y≦1), and a contact layer; a first metal layer provided on the contact layer and being capable of reflecting emission light from the light emitting layer; and a second metal layer provided on the substrate and bonded to the first metal layer, the p-type cladding layer being located more distant from a bonding interface between the first metal layer and the second metal layer than the light emitting layer, and the p-type cladding layer having a carrier concentration of $0.5\times10^{17}$ $cm^{-3}$ or more and $3\times10^{17}$ $cm^{-3}$ or less.

DETAILED DESCRIPTION OF THE INVENTION

Embodiments of the invention will now be described with reference to the drawings.

Figure 1:
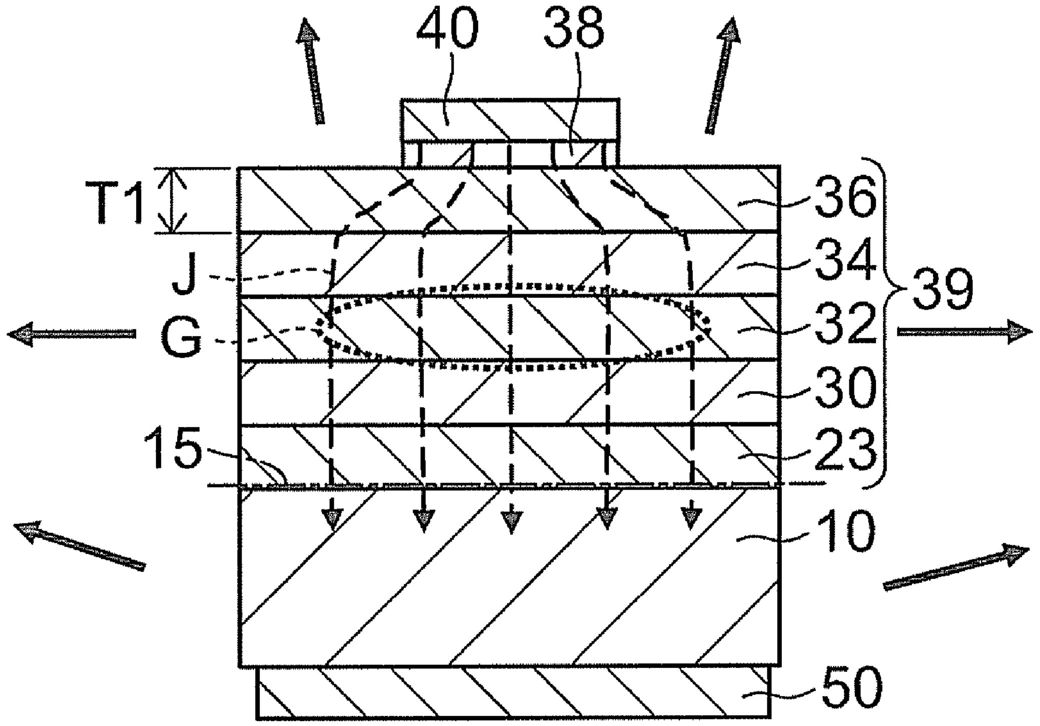
FIG. 1 is a schematic cross-sectional view of a light emitting device according to a first embodiment of the invention.

FIG. 1 is a schematic cross-sectional view of a light emitting device according to a first embodiment of the invention.

A first substrate 10 illustratively made of n-type GaP and a bonding layer 23 made of n-type $In_x(Al_{0.5}Ga_{0.5})_{1-x}P$ (0≦x≦1) are bonded together at a bonding interface 15.

On the bonding layer 23 is formed a growth layer in which an n-type cladding layer 30 made of n-type InAlP (carrier concentration $4\times10^{17}$ $cm^{-3}$), a light emitting layer 32 made of MQW (multi-quantum well), a p-type cladding layer 34 (thickness 0.6 μm) made of p-type InAlP, and a current diffusion layer 36 (carrier concentration $1\times10^{18}$ $cm^{-3}$, thickness T1 being 1.5 μm) made of p-type $In_x(Al_{0.7}Ga_{0.3})_{1-x}P$ (0≦x≦1) are crystal grown in this order.

The growth layer can be represented by a composition formula $In_x(Al_yGa_{1-y})_{1-x}P$ (0≦x≦1, 0≦y≦1).

The p-type cladding layer 34 constituting the growth layer is doped with Zn, Mg, and C so that the p-type carrier concentration is in the range of 0.5-$3\times10^{17}$ $cm^{-3}$. The bonding layer 23 and the growth layer are hereinafter collectively referred to as a stacked body 39.

A contact layer 38 made of p-type GaAs is provided on the current diffusion layer 36, and a p-side electrode 40 is formed on the contact layer 38. Furthermore, an n-side electrode 50 is formed on the backside of the first substrate 10.

The light emitting layer 32 can have a MQW structure in which well layers having a width in the range of e.g. 3-15 nm and barrier layers sandwiching the well layers and having a width in the range of 3-30 nm are alternately stacked. The number of wells can illustratively be 10-50. If the well layer has a composition of $In_{0.5}(Al_{0.04}Ga_{0.96})_{0.5}P$ and the barrier layer has a composition of $In_{0.5}(Al_{0.8}Ga_{0.2})_{0.5}P$, then the emission light can have a wavelength near 615 nm.

A current J (indicated by dashed lines) injected from the p-side electrode 40 is laterally spread in the current diffusion layer 36 to produce a light emitting region G indicated by the dotted line. Part of light directed upward from the light emitting region G is blocked by the p-side electrode 40. Part of light directed downward from the light emitting region G is reflected by the n-side electrode 50 and emitted upward. The light can be emitted also directly laterally from the light emitting region G.

Figure 2A:
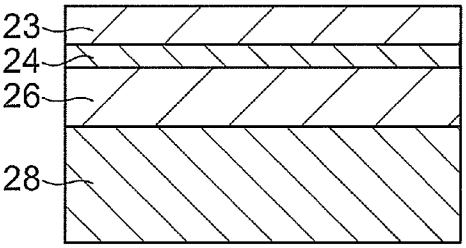
FIGS. 2A, 2B, 2C and 2D are process cross-sectional views of a method for manufacturing a light emitting device according to the first embodiment.

FIGS. 2A, 2B, 2C and 2D are process cross-sectional views of a method for manufacturing a light emitting device according to the first embodiment. As shown in FIG. 2A, on a second substrate 28 illustratively made of GaAs, which is easily lattice-matched with the light emitting layer 32, a buffer layer 26 (thickness 0.5 μm) made of n-type GaAs, a buffer layer 24 (thickness 0.5 μm) made of n-type InGaAlP, and a bonding layer 23 (0.5 μm) made of n-type InGaAlP are crystal grown in this order illustratively by MOCVD (metal organic chemical vapor deposition) or MBE (molecular beam epitaxy) method.

Figure 2B:
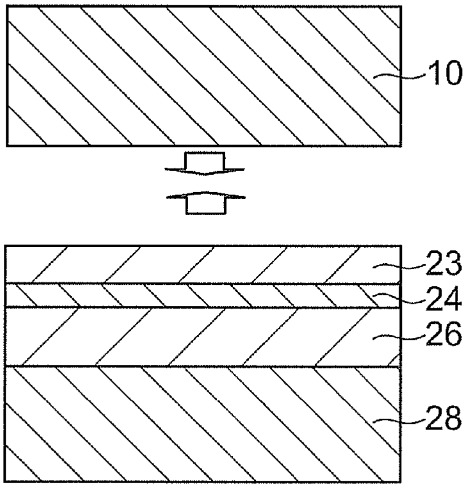
Figure 2C:
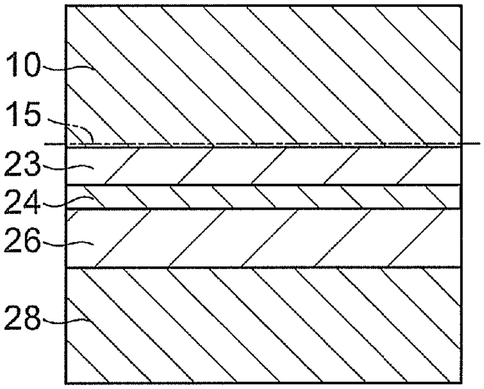

Subsequently, as shown in FIG. 2B, the bonding layer 23 and an n-type GaP substrate 10 are laminated face-to-face and brought into close contact. Heat treatment in a hydrogen or inert gas atmosphere results in bonding at the bonding interface 15 as shown in FIG. 2C. The heat treatment temperature is illustratively in the range of 700-830° C.

Figure 2D:
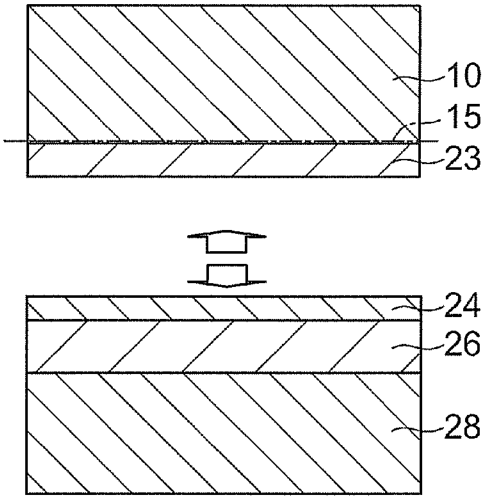

Subsequently, the second substrate 28 and the buffer layers 26 and 24 are removed illustratively by wet etching. As shown in FIG. 2D, this results in a foundation substrate in which the bonding layer 23 is formed on the first substrate 10. If the first substrate 10 is made of GaP (lattice constant being generally 5.4512 angstroms), then deviation in lattice constants occurs at the bonding interface 15 between the substrate 10 and the bonding layer 23, which is generally lattice-matched with GaAs (lattice constant being generally 5.6533 angstroms).

This embodiment can reduce the deviation in lattice constants between the bonding layer 23 of the foundation substrate and the growth layer regrown on the surface of the bonding layer 23, and can easily reduce crystal defects such as misfit dislocations.

Furthermore, because the p-type cladding layer 34 is crystal grown on the light emitting layer 32, the p-type cladding layer 34 is located more distant from the bonding interface 15 than the light emitting layer 32 and the n-type cladding layer 30. Typically, the acceptor such as Zn has a higher diffusion coefficient than the donor such as Si and migrates more easily by diffusion at high temperatures. Thus, in this embodiment, which can reduce the thermal history time of the p-type cladding layer 34, it is easy to prevent acceptors such as Zn from diffusing into the light emitting layer 32.

On the stacked body 39, a contact layer 38 made of p-type GaAs can be grown by a continuous crystal growth process. A p-side electrode 40 formed on the contact layer 38 can be used as a mask to remove the contact layer in the region outside the p-side electrode 40 illustratively by etching. Then, the light emitting device of FIG. 1 is completed. In this configuration, optical absorption due to surface GaAs can be easily reduced to enhance the brightness while maintaining good ohmic contact with the p-side electrode 40.

The light emitting layer 32 preferably has a MQW structure. For example, the number of wells can be in the range of 20-50. The well layer can be of p-type and have a width in the range of 5-15 nm. Furthermore, the barrier layers sandwiching the well layer on both sides can be of p-type and have a width in the range of 5-30 nm. If the light emitting layer 32 has p-type conductivity, the brightness can be easily enhanced in the visible light wavelength range. Here, the carrier concentration therein is preferably lower than the carrier concentration in the p-type cladding layer 34 to prevent brightness decrease due to nonradiative recombination. The number of well layers of the MQW in the above range facilitates preventing carrier overflow to enhance light emission efficiency.

Figure 3:
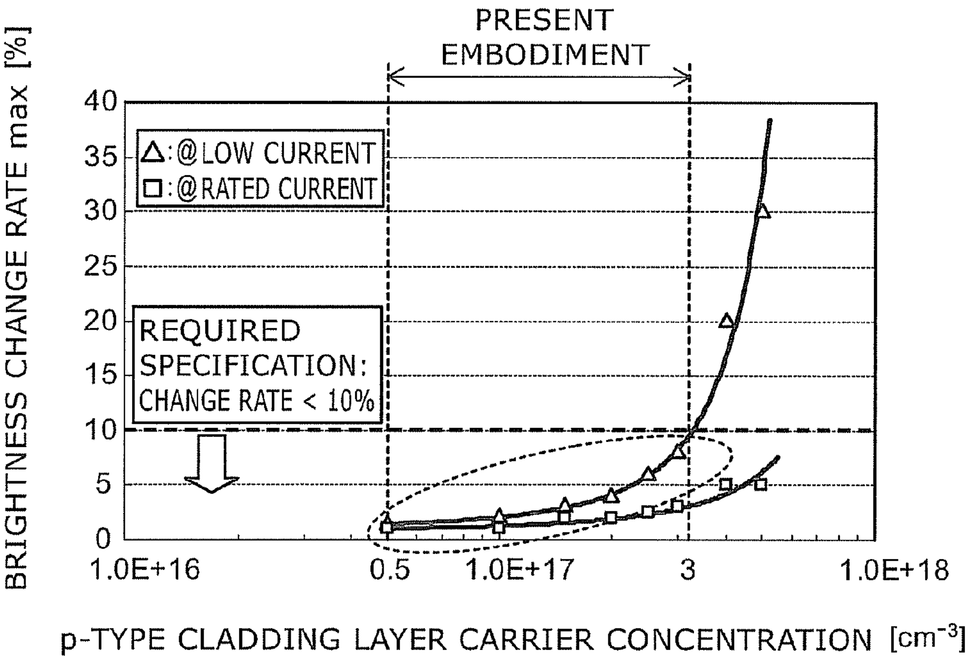
FIG. 3 is a graph showing the brightness change rate of the light emitting device.

FIG. 3 is a graph showing the brightness change rate of the light emitting device. More specifically, the vertical axis represents the brightness change rate maximum (%) after 1000-hour burn-in operation, and the horizontal axis represents the p-type cladding layer carrier concentration ($cm^{-3}$). This figure shows the brightness change rate maximum at room temperature (25° C.).

In automobile use applications such as stoplights and taillights, the operating current is often used in one of two states, that is, rated current (□) and low current (Δ). That is, the rated current provides a high brightness, whereas the low current, which is generally one tenth of the rated current, provides a low brightness. In the burn-in test at the maximum rated current, conventional automobile use applications require that after 1000-hour operation, the brightness change rate maximum (max) be within 130%. However, recent applications have been more demanding, requiring that the brightness change rate maximum be within ±10%.

The characteristics shown in FIG. 3 are those of the MQW structure in which the number of wells is 40, the p-type carrier concentration (acceptor Zn) is generally $5\times10^{16}$ $cm^{-3}$, the composition of the well layer is $In_{0.5}(Al_{0.04}Ga_{0.96})_{0.5}P$, the composition of the barrier layer is $In_{0.5}(Al_{0.8}Ga_{0.2})_{0.5}P$, and the acceptor is Zn.

The brightness change rate maximum of the light emitting device increases with the increase of carrier concentration in the p-type cladding layer 34. In the case of rated current operation, the brightness change rate maximum is generally 5% even at a p-type cladding layer concentration of generally $5\times10^{17}$ $cm^{-3}$, satisfying the requirement. On the other hand, in the case of low current operation, the brightness starts to decrease when the carrier concentration in the p-type cladding layer 34 exceeds $3\times10^{17}$ $cm^{-3}$, and the brightness change rate maximum exceeds 10%.

In the low current operation, the sharp decrease of brightness associated with the increase of p-type carrier concentration can be attributed to the increase of nonradiative centers resulting from deep levels formed by acceptors such as Zn diffused into the light emitting layer 32. More specifically, the increase of p-type acceptor concentration results in the increase of acceptors diffusing from the p-type cladding layer 34 into the light emitting layer 32. Some of the acceptors populate crystal defects, whereas some enter into interstitial sites or lattice points to generate crystal defects. Crystal defects populated with Zn act as nonradiative recombination centers and lead to recombination-enhanced defect motion, where nonradiative recombination of injected carriers due to energization causes crystal defects to migrate. Thus, crystal defects are spread into the light emitting layer 32 and may advance brightness decrease.

Nonradiative recombination occurs also in the rated current operation. However, in the low current operation where the amount of injected carriers is small, the proportion of nonradiative recombination is relatively high and increases the brightness change rate. Thus, the upper limit of the p-type carrier concentration is preferably $3\times10^{17}$ cm$^{-3}$.

Besides Zn, the acceptor can be Mg and C. The diffusion coefficient of Mg and C is lower than the diffusion coefficient of Zn, and allows the upper limit of the p-type carrier concentration for a brightness change rate of 10% or less to be higher than $3\times10^{17}$ cm$^{-3}$.

According to the inventors' experiments, it is found that there is no substantial diffusion of donors such as Si into the light emitting layer 32 from the n-type cladding layer 30, which is located nearer to the bonding interface 15 than the light emitting layer 32. It is also found that variation of the parameters of the well layers and the barrier layers in the aforementioned ranges hardly affects the diffusion of acceptors. That is, the brightness change rate has weak dependence on these parameters, and is determined substantially by the p-type cladding layer carrier concentration as shown in FIG. 3.

Figure 4:
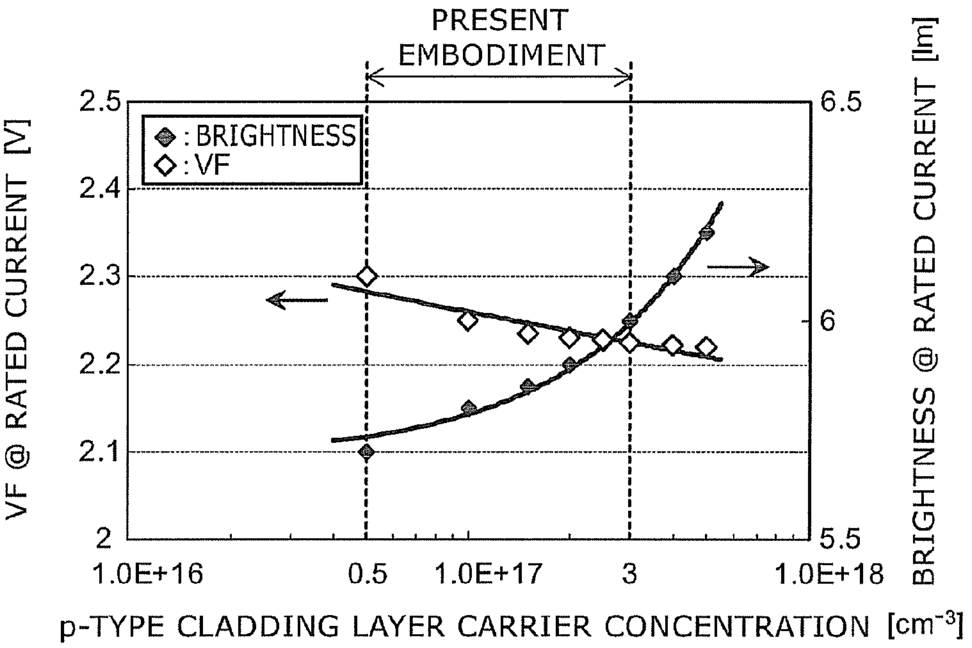
FIG. 4 is a graph showing the initial characteristics of forward voltage VF and brightness.

FIG. 4 is a graph showing the initial characteristics of forward voltage VF and brightness. More specifically, the vertical axis represents forward voltage VF (V) at rated current and brightness at rated current (lm, lumens), and the horizontal axis represents carrier concentration in the p-type cladding layer (cm$^{-3}$).

The forward voltage VF at rated current, indicated by the symbol (◇), increases with the decrease of carrier concentration in the p-type cladding layer 34. In the range of p-type cladding layer carrier concentration of this embodiment, the forward voltage VF is in the range of 2.22 V or more and 2.30 V or less.

The brightness at rated current, indicated by the symbol (♦), decreases with the decrease of carrier concentration in the p-type cladding layer 34. In the range of p-type cladding layer carrier concentration of this embodiment, the brightness is in the range of 5.7 lm or more and 6.0 lm or less. Increased forward voltage VF and decreased brightness unfavorably result in decreasing the luminous efficiency. Thus, the lower limit of the p-type carrier concentration is preferably $0.5\times10^{17}$ cm$^{-3}$. That is, if the p-type carrier concentration is in the range of 0.5-$3\times10^{17}$ cm$^{-3}$, the brightness change rate maximum after 1000-hour operation at rated current and low current is easily limited to 10% or less while maintaining the initial characteristics of forward voltage VF and brightness within the required specification.

Figure 5A:
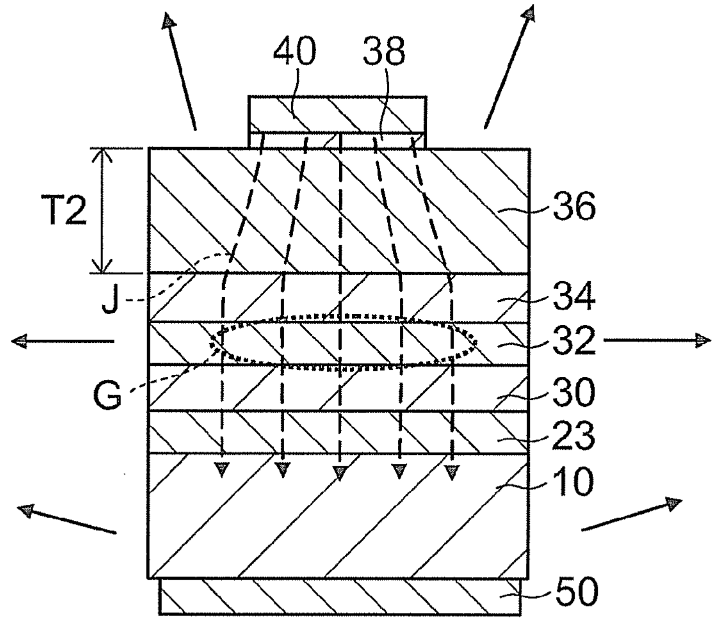
FIG. 5A and FIG. 5B are schematic cross-sectional views of a light emitting device according to variations of the first embodiment.
Figure 5B:
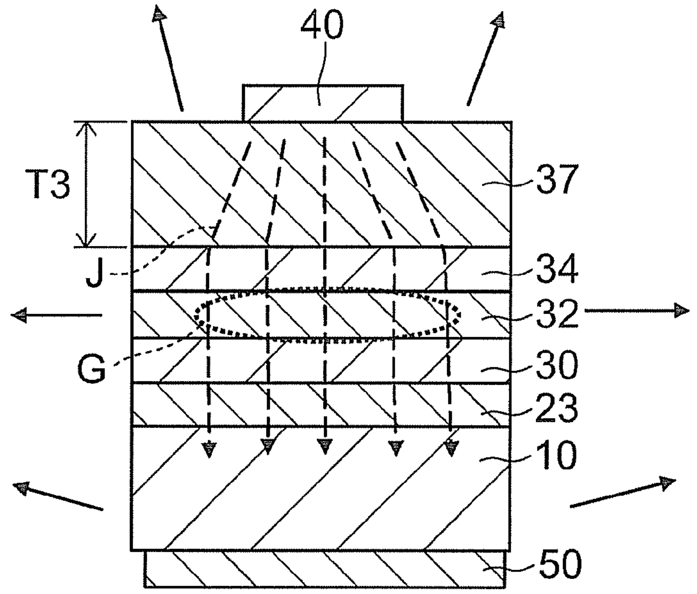

FIG. 5A and FIG. 5B are schematic cross-sectional views of a light emitting device according to variations of the first embodiment. More specifically, FIG. 5A shows a first variation, and FIG. 5B shows a second variation.

In FIG. 5A, like the first embodiment, the current diffusion layer 36 has a composition of p-type $In_{0.5}(Al_{0.7}Ga_{0.3})_{0.5}P$ and a carrier concentration of $1\times10^{18}$ cm$^{-3}$, but its thickness T2 is larger than T1 (=1.5 μm). If T2 is illustratively 3 μm, the current J flowing through the light emitting layer 32 spreads more widely in the plane thereof and facilitates increasing the brightness. Furthermore, this serves to reduce the amount of light blocked by the p-side electrode 40 and facilitates increasing the efficiency of upward and lateral light extraction.

In FIG. 5B, the current diffusion layer 37 has a composition of p-type GaP and a carrier concentration of $1\times10^{18}$ cm$^{-3}$, but its thickness T3 is larger than T1, such as 3 μm. In this case, the contact layer can be omitted.

In the first and second variation, because the thickness T2 of the current diffusion layer 36 and the thickness T3 of the current diffusion layer 37 are larger than T1 (=1.5 μm), a longer crystal growth time is needed. However, acceptor doping is performed so that the carrier concentration is limited in the range of 0.5-$3\times10^{17}$ cm$^{-3}$. This prevents acceptors from diffusing into the light emitting layer 32 and facilitates reducing the brightness decrease.

Figure 6A:
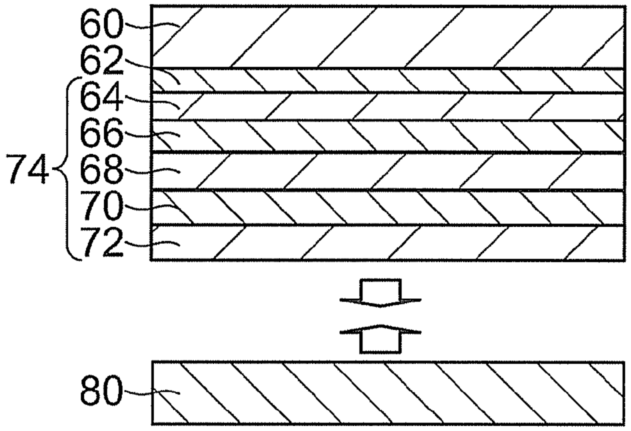
FIGS. 6A, 6B, 6C and 6D are schematic views showing a light emitting device according to a second embodiment.
Figure 6B:
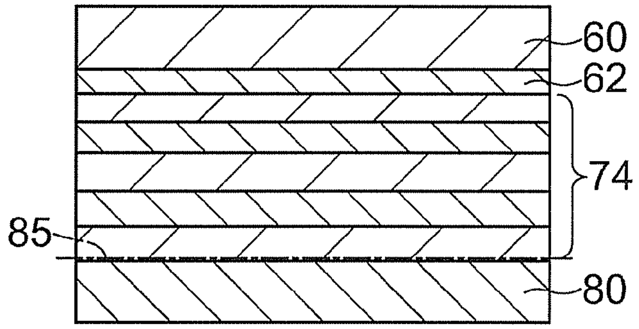
Figure 6C:
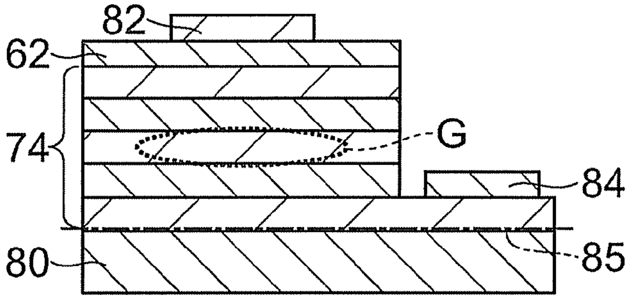
Figure 6D:
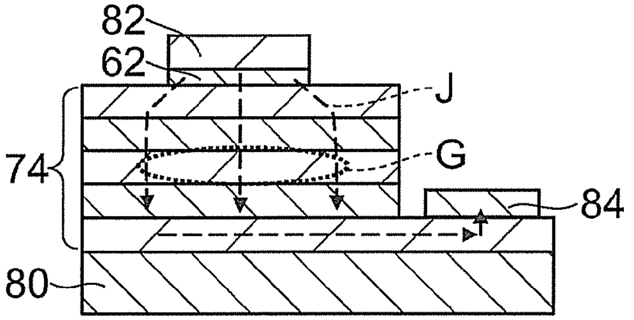

FIGS. 6A, 6B, 6C and 6D are schematic views showing a light emitting device according to a second embodiment. More specifically, FIGS. 6A, 6B, and 6C are process cross-sectional views showing a manufacturing method, and FIG. 6D is a schematic cross-sectional view.

On a third substrate 60 illustratively made of GaAs, a contact layer 62 made of p-type GaAs, a p-type current diffusion layer 64 (carrier concentration $1\times10^{18}$ cm$^{-3}$), a p-type cladding layer 66 (carrier concentration $1.5\times10^{17}$ cm$^{-3}$) made of InAlP, a light emitting layer 68 made of p-type MQW, a cladding layer 70 (carrier concentration $4\times10^{17}$ cm$^{-3}$) made of n-type InAlP, and an n-side contact layer 72 are grown in this order illustratively by MOCVD or MBE to form a stacked body 74 (FIG. 6A). That is, the second embodiment needs only one step of crystal growth.

Subsequently, as shown in FIG. 6B, a substrate 80 such as GaP or sapphire, which is conductive and transparent to emission light from the light emitting layer 68, and the aforementioned contact layer 72 (bonding layer) are laminated and bonded together by heating. In this case, because no current is to flow between the contact layer 72 and the high-resistance substrate 80, the heating temperature only needs to ensure mechanical strength. For example, bonding can be performed in a lower temperature range than in the first embodiment, such as 600-750° C. This facilitates reducing stress on the light emitting layer 68. Then, the third substrate 60 is removed illustratively by wet etching.

The term "high-resistance substrate" used herein refers to a substrate having high resistivity such that the perpendicular current in the thickness direction of the substrate can be made sufficiently lower than the lateral current along the bonding interface.

Subsequently, as shown in FIG. 6C, part of the stacked body is etched away to expose the surface of the n-side contact layer 72, on which an n-side electrode 84 is formed. On the other hand, a p-side electrode 82 is formed on the p-type contact layer 62.

The p-side electrode 82 is used as a mask to remove the contact layer 62 outside the immediately underlying region of the p-side electrode 82 illustratively by wet etching. Then, the light emitting device is completed as shown in FIG. 6D. The light emitting device of FIG. 6D can be used as a flip-chip structure.

In the second embodiment, the p-type cladding layer 66 is located more distant from the bonding interface 85 than the light emitting layer 68, and the stress produced in the light emitting layer 68 on the side nearer to the p-type cladding layer 66 by heated bonding is lower than the stress produced in the light emitting layer 68 on the side nearer to the n-type cladding layer 70. High stress on the light emitting layer is likely to increase crystal defects. That is, crystal defects on the side nearer to the p-type cladding layer 66, where the stress applied is lower, can be made fewer than crystal defects on the side nearer to the n-type cladding layer 70.

In general, increase of crystal defects such as interstitial atoms, vacancies, and dislocations is likely to induce entry of acceptors into the light emitting layer and increase nonradiative centers. In this embodiment, the p-type cladding layer doped with acceptors such as Zn is provided adjacent to the side with fewer crystal defects. This can prevent acceptors from entering the light emitting layer in the heated bonding process. Also in this case, if the carrier concentration in the p-type cladding layer 66 is in the range of $0.5\text{-}3\times10^{17}$ $cm^{-3}$, the brightness change rate in the low current operation is easily limited to 10% or less as shown in FIG. 3.

Figure 7A:
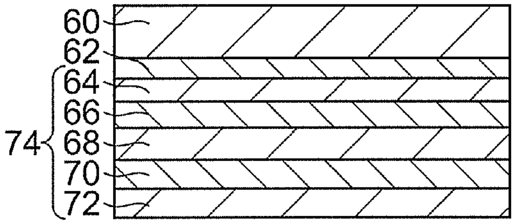
FIGS. 7A, 7B, 7C and 7D show a light emitting device according to a third embodiment.
Figure 7B:
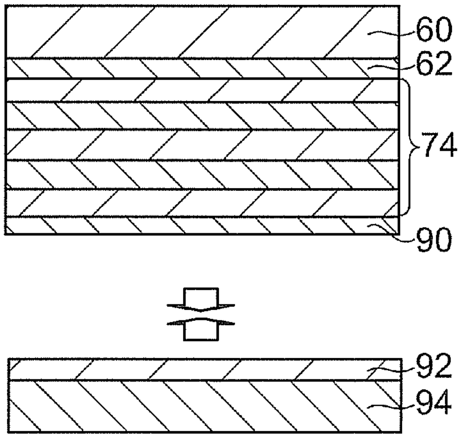
Figure 7C:
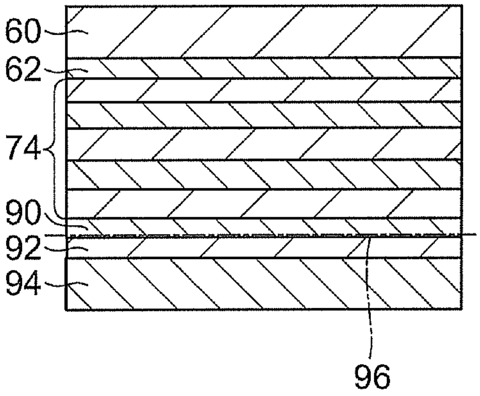
Figure 7D:
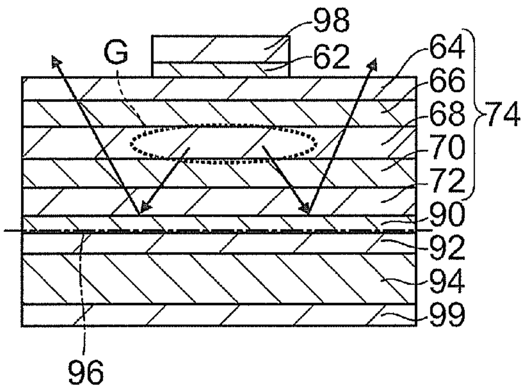

FIGS. 7A, 7B, 7C and 7D show a light emitting device according to a third embodiment. More specifically, FIGS. 7A, 7B, and 7C are process cross-sectional views of a manufacturing method, and FIG. 7D is a schematic cross-sectional view.

First, on a third substrate 60 illustratively made of GaAs, as in FIG. 6A, a contact layer 62 made of p-type GaAs, a p-type current diffusion layer 64, a p-type cladding layer 66, a light emitting layer 68, an n-type cladding layer 70, and a contact layer 72 are illustratively stacked by crystal growth (FIG. 7A).

Subsequently, as shown in FIG. 7B, a first metal layer 90 illustratively made of AuGe is formed on the contact layer 72. Alternatively, an Au layer may be provided on the AuGe layer on the contact layer 72 to constitute a first metal layer 90. On the other hand, a second metal layer 92 illustratively made of Au is formed on a fourth substrate 94 illustratively made of n-type Si, which has a lattice constant different from that of the light emitting layer 68. The first metal layer 90 and the second metal layer 92 are laminated face-to-face and bonded together by heating. In this case, the melting point of AuGe eutectic solder is generally 360° C., and the bonding temperature for the Au layer and the AuGe layer can be in the range from the melting point to generally 500° C. Bonding in a vacuum atmosphere is more preferable because voids are reduced at the bonding interface 96. Then, the third substrate 60 is removed illustratively by wet etching.

Subsequently, a p-side electrode 98 is formed on the contact layer 62, and an n-side electrode 99 is formed on the backside of the substrate 94. The p-side electrode 98 is used as a mask to leave only the portion of the contact layer 62 immediately below the p-side electrode 98 and remove the rest. Thus, the light emitting device is completed.

In the third embodiment, the p-type cladding layer 66 is located more distant from the bonding interface 96 than the light emitting layer 68. The stress produced in the light emitting layer 68 on the side nearer to the p-type cladding layer 66, due to the linear expansion coefficient difference between the semiconductor material and the metal material under heating, is lower than the stress produced in the light emitting layer 68 on the side nearer to the n-type cladding layer 70. Here, the linear expansion coefficient is $1.42\times10^{-5}$/° C. for Au and $5.9\times10^{-6}$/° C. for GaAs, higher for metals than for semiconductors.

In this embodiment, crystal defects in the light emitting layer 68 on the side nearer to the p-type cladding layer 66, where the stress is lower, can be easily made fewer than crystal defects in the light emitting layer 68 on the side nearer to the n-type cladding layer 70.

Furthermore, the temperature for bonding the first metal layer 90 and the second metal layer 92 can be made lower than the temperature for bonding the substrate and the semiconductor bonding layer in the second embodiment. Hence, crystal defects can be reduced more easily.

Thus, this embodiment, where the p-type cladding layer 34 doped with acceptors is provided adjacent to the side with fewer crystal defects, can prevent acceptors from entering the light emitting layer 68. Also in this case, if the carrier concentration in the p-type cladding layer 66 is in the range of $0.5\text{-}3\times10^{17}$ $cm^{-3}$, the brightness change rate in the low current operation is easily limited to 10% or less as shown in FIG. 3.

In the third embodiment, emission light directed downward from the light emitting region G is reflected upward by the first metal layer 90, which facilitates enhancing the light extraction efficiency. Hence, the fourth substrate may be made of a material opaque to light, such as Si.

In the first embodiment and the associated variations, the p-type cladding layer is crystal grown after the light emitting layer is grown, and the p-type cladding layer is located more distant from the bonding interface than the light emitting layer. In the second and third embodiment, to reduce the effect of stress produced in the heated bonding process due to the linear expansion coefficient difference, the p-type cladding layer is located more distant from the bonding interface than the light emitting layer. These facilitate preventing acceptors from diffusing into the light emitting layer. Furthermore, in the first to third embodiment and the associated variations, the carrier concentration in the p-type cladding layer is limited in the range of $0.5\text{-}3\times10^{17}$ $cm^{-3}$, and thereby the brightness decrease is easily reduced also in the low current operation.

Thus, in the operating range between the rated current and the low current, which is generally one tenth of the rated current, the brightness change rate after long-term operation is easily limited to as low as 10% or less. Hence, the embodiments of the invention can provide a light emitting device with improved reliability, which can be stably operated under demanding use conditions, such as in car stoplights and taillights. Furthermore, this light emitting device can easily maintain stable brightness in a wide range of operating current also in such applications as illumination lamps, traffic signals, and large display devices.

The conductivity type of the substrate, contact layer, stacked body and the like is not limited to that in the first to third embodiment and the associated variations, but they may have the opposite conductivity type.

The embodiments of the invention have been described with reference to the drawings. However, the invention is not limited to these embodiments. For example, those skilled in the art can variously modify the material, size, shape, layout and the like of the substrate, stacked body, light emitting layer, p-type cladding layer, bonding layer, bonding interface, current diffusion layer, metal layer and the like constituting the embodiments of the invention, and such modifications are also encompassed within the scope of the invention unless they depart from the spirit of the invention.

The invention claimed is:

1. A light emitting device comprising:

a stacked body including at least a light emitting layer made of $In_x(Al_yGa_{1-y})_{1-x}P$ ($0\leqq x\leqq 1$, $0\leqq y\leqq 1$), a p-type cladding layer made of $In_x(Al_yGa_{1-y})_{1-x}P$ ($0\leqq x\leqq 1$, $0\leqq y\leqq 1$), a p-type current diffusion layer made of $In_x(Al_yGa_{1-y})_{1-x}P$ ($0\leqq x\leqq 1$, $0\leqq y\leqq 1$) or GaP, and a bonding layer made of a semiconductor;

a p-side electrode;

a substrate in which deviation in a lattice constant at a bonding interface with the bonding layer is larger than deviation in lattice constants between the light emitting layer and the bonding layer; and a contact layer provided between the p-side electrode and the current diffusion layer, having generally the same size as the p-side electrode, and made of p-type GaAs, the p-type cladding layer being located more distant from the bonding interface than the light emitting layer, the p-type cladding layer having a carrier concentration of $0.5\times10^{17}$ $cm^{-3}$ or more and $3\times10^{17}$ $cm^{-3}$ or less, and the p-type current diffusion layer being provided between the p-side electrode and the p-type cladding layer.

2. The light emitting device according to claim 1, wherein the light emitting layer has a multi-quantum well structure.

3. The light emitting device according to claim 1, wherein the light emitting layer is of p-type and an impurity concentration in the light emitting layer is less than or equal to the impurity concentration in the p-type cladding layer.

4. The light emitting device according to claim 3, wherein the p-type cladding layer and the light emitting layer are doped with an acceptor, which is one of Zn, Mg, and C.

5. The light emitting device according to claim 1, wherein the substrate is made of n-type GaP.

6. The light emitting device according to claim 5, wherein the bonding layer is made of $In_x(Al_yGa_{1-y})_{1-x}P$ ($0 \leqq x \leqq 1$, $0 \leqq y \leqq 1$).

7. A light emitting device comprising:

a stacked body including at least a light emitting layer made of $In_x(Al_yGa_{1-y})_{1-x}P$ ($0 \leqq x \leqq 1$, $0 \leqq y \leqq 1$), a p-type cladding layer made of $In_x(Al_yGa_{1-y})_{1-x}P$ ($0 \leqq x \leqq 1$, $0 \leqq y \leqq 1$), and a bonding layer made of a semiconductor; and a substrate in which deviation in a lattice constant at a bonding interface with the bonding layer is larger than deviation in lattice constants between the light emitting layer and the bonding layer, the p-type cladding layer being located more distant from the bonding interface than the light emitting layer, the p-type cladding layer having a carrier concentration of $0.5 \times 10^{17}$ $cm^{-3}$ or more and $3 \times 10^{17}$ $cm^{-3}$ or less, the substrate being transparent to emission light from the light emitting layer and having a high resistance, and an n-side electrode being formed on part of a surface of the bonding layer on an opposite side of the bonding interface.

8. The light emitting device according to claim 7, wherein the substrate is made of one of sapphire and GaP.

* * * * *